United States Patent
Camenzind

[15] 3,668,540

[45] June 6, 1972

[54] INTEGRATED VIDEO AMPLIFIER

[72] Inventor: Hans R. Camenzind, Los Altos, Calif.

[73] Assignee: Signetics Corporation, Sunnyvale, Calif.

[22] Filed: July 13, 1970

[21] Appl. No.: 56,205

Related U.S. Application Data

[63] Continuation of Ser. No. 791,661, Jan. 6, 1969, abandoned.

[52] U.S. Cl. ....................................330/18, 330/20, 330/25, 330/28, 330/30 R, 330/38 M

[51] Int. Cl. .......................................................H03f 3/42

[58] Field of Search .......................................330/18–20, 25, 330/28, 38 R, 38 M, 30 R

[56] References Cited

UNITED STATES PATENTS 3,416,092 12/1968 Frederiksen............................330/19

OTHER PUBLICATIONS

Teague, " Get PNP Class–B Stage Efficiency," Electronic Design, March 15, 1967, pp.238–240

*Primary Examiner*—Roy Lake
*Assistant Examiner*—James B. Mullins
*Attorney*—Flehr, Hohbach, Test, Albritton & Herbert

[57] ABSTRACT

Integrated video amplifier having an output voltage which is accurately held to one-half of the supply voltage and which utilizes a class B output stage.

3 Claims, 4 Drawing Figures

INVENTOR.
Hans R. Camenzind
BY Flehr, Hohbach, Test, Albritton & Herbert
Attorneys

INTEGRATED VIDEO AMPLIFIER

This is a continuation of U.S. Pat. application Ser. No. 791,661, filed Jan. 16, 1969 and now abandoned.

BACKGROUND OF THE INVENTION

Integrated circuits have made limited penetrations into certain fields as, for example, in applications which require high voltages, i.e., voltages substantially greater than 50 volts. In the past, this limitation has been due to the planar process itself. In order to diffuse in selected areas, a thin oxide layer must be present at the surface of the silicon slice. Positive charges in this oxide, created by traces of sodium, attract electrons to the surface of the slice. In order to achieve a large breakdown voltage, the concentration of carriers must be very low (i.e., high resistivity) so that the carrier-free region created by the applied voltage (the depletion layer) has sufficient thickness to keep the electric field below the critical value for silicon (approximately 30 volts per micron). With positive charges in the surface oxide and high resistivity silicon, the carrier concentration near the surface can be many times that of the bulk. The depletion layer, therefore, narrows, the field increases and the devices break down at a voltage much below the intended value. Even if the charges in the oxide layer could be removed, the small radius of the diffused base junction (about 4 microns) would concentrate the field around it (similar to the corona effect), and thus result in premature breakdown. Thus, there is a need for high voltage integrated circuits particularly such as those which are utilized in television.

SUMMARY OF THE INVENTION AND OBJECTS

The integrated video amplifier consists of a unitary semiconductor structure with first and second transistor amplifiers formed in said semiconductor structure. Each of the amplifiers has a base, a collector and an emitter. Means is provided for connecting the input to the base of the first transistor amplifier and means is provided for biasing the first and second transistors so they remain in their active regions during operation of the amplifier. The second transistor amplifier forms a portion of the output stage of the amplifier. Means is provided for forming an output terminal and means is connected to the output terminal and to the second transistor amplifier to cause the output stage to operate in class B.

In general, it is an object of the present invention to provide an integrated video amplifier which is capable of withstanding the high voltages encountered.

Another object of the invention is to provide an amplifier of the above character which is able to withstand wide voltage swings.

Another object of the invention is to provide an amplifier of the above character which has a good frequency response.

Another object of the invention is to provide an amplifier of the above character in which the output voltage is accurately held to one-half the supply voltage regardless of the absolute value of the resistors or any other components in the circuit.

Another object of the invention is to provide a video amplifier of the above character in which the output stage is operated in class B.

Another object of the invention is to provide an amplifier of the above character which requires relatively little power dissipation.

Additional objects and features of the invention will appear from the following description in which the preferred embodiment is set forth in detail in conjunction with the accompanying drawing.

DESCRIPTION OF THE PREFERRED EMBODIMENT

Figure 2:
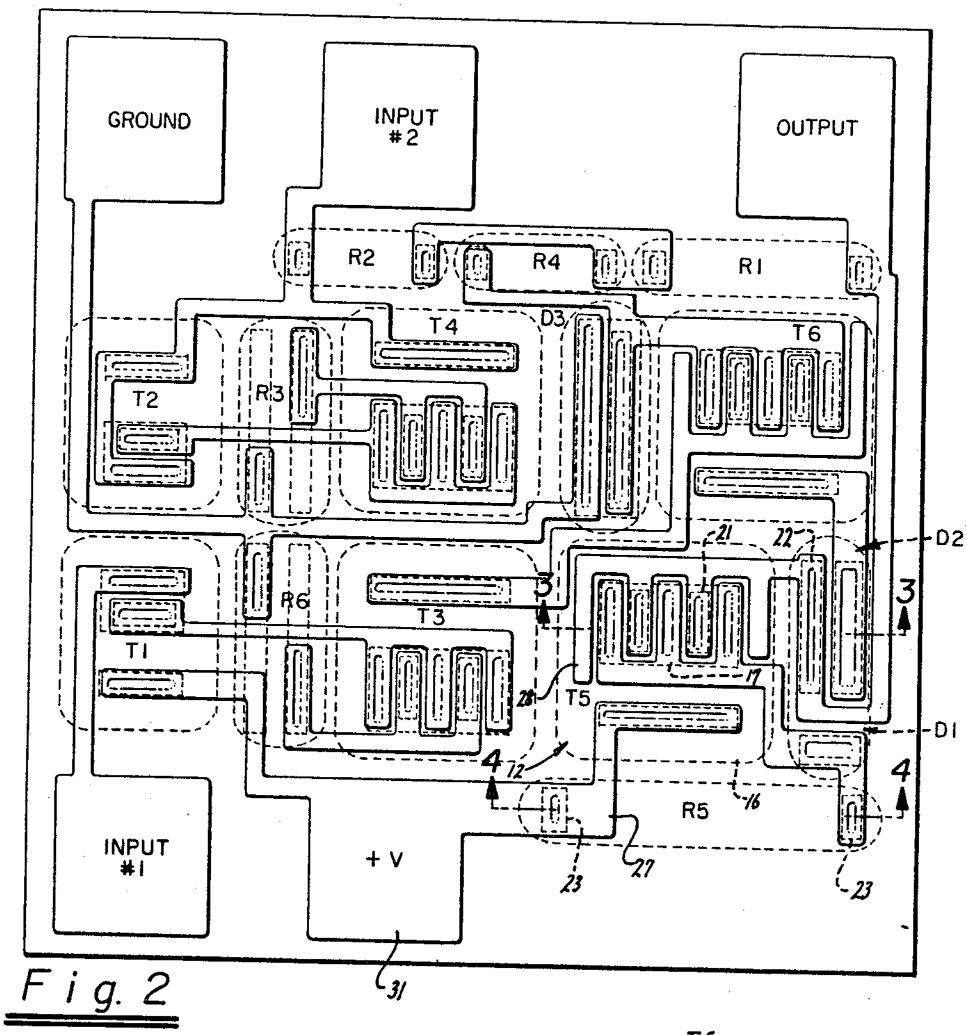
FIG. 2 is a plan view of an integrated video amplifier incorporating the circuit shown in FIG. 1.
Figure 1:
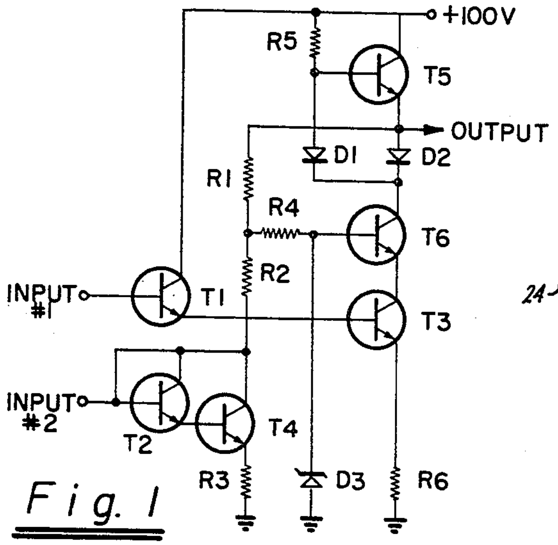
FIG. 1 is a circuit diagram of a video amplifier incorporating the present invention.

The circuit diagram for the video amplifier incorporating the present invention is shown in FIG. 1 and this has been integrated into a single unitary semiconductor structure as shown in FIG. 2. The semiconductor structure shown in FIGS. 2, 3 and 4 consists of a support body 11 which is formed of a suitable material such as polycrystalline silicon. A plurality of islands 12 of a suitable semiconductor material such as single or monocrystalline silicon are carried by the support body and are dielectrically isolated from each other and the support body by a layer 13 of a suitable insulating material such as silicon dioxide. The islands 12, the layer of insulating material 13 and the support body 11 form a solid unitary structure.

Figure 3:
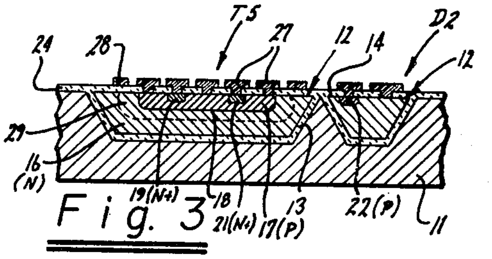
FIG. 3 is a cross-sectional view taken along the line 3—3 of FIG. 2.
Figure 4:
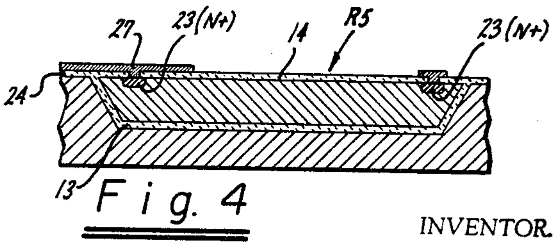
FIG. 4 is a cross-sectional view taken along the line 4—4 of FIG. 2.

The active and passive devices which make up the circuit which is shown in FIG. 1 are formed in the islands 12 and thus the various elements which make up the video amplifier have been labelled both in the circuit diagram in FIG. 1 and also in the plan view of the semiconductor structure shown in FIG. 2. The cross-sectional view shown in FIG. 3 shows a typical construction of active devices in the integrated video amplifier. Thus, the transistor T5 is provided with a top surface 14 which is also the top surface of the island 12. The lower portion of the island forms the collector region 16 which, as shown, can be of one conductivity type, namely, N-type conductivity. A region 17 of opposite conductivity type, namely P conductivity, is formed within the region 16 to provide a P-N junction 18 which extends to the surface 14. A plurality of regions 19 of the first conductivity type are disposed within the region 17 and form junctions 21 which extend to the surface. Thus, typically, the regions 19 can be heavily doped with an impurity of the first conductivity type to provide N+ regions.

It should be appreciated that several of the diffusion steps for forming the various devices are carried out simultaneously. Thus, the diffusion of the P-type region 22 for the diode D2 can be formed at the same time that the region 17 is being formed in the transistor T5. Similarly, for the resistor R5, the N+ regions 23 can be formed at the same time that the N+ regions 19 are being formed in the transistor T5.

After all the diffusion operations have been completed, a layer 24 of suitable insulating material such as silicon dioxide is deposited on the surface 14 and overlying the active and passive devices. Thereafter, windows 26 are formed in the silicon dioxide to expose the desired regions of the active and passive devices. Metallization in the form of a suitable metal such as aluminum is deposited into the windows 26 and onto the insulating layer 24, and thereafter the undesired portions of the metallization are removed so that there remains contact elements 27 which engage the desired regions of the active and passive devices. Thus, as shown in FIG. 3, the contact elements engage the regions 16, 17 and 19 which form the collector, base and emitter regions, respectively, of the transistor T5. The contact elements make contact with the various regions of the diodes and of the bulk resistors. The metallization is also utilized to provide a field plate 28 for the transistor T5 and which generally overlies a substantial portion of the depletion region 29.

The operation and function of the field plate is described in copending application, Ser. No. 791,665, filed Jan. 16, 1969, entitled "High Voltage Bipolar Semiconductor Device and Integrated Circuit Using the Same and Method". Similarly, the operation of dielectrically isolated bulk resistors is explained in copending application, Ser. No. 791,660, filed Jan. 16, 1969, entitled "Bulk Resistor and Integrated Circuit Using Same".

From FIG. 2, it can be seen that the contact elements 27 make connections with certain contact pads 31 which are supported by and form a part of the semiconductor structure. The contact pads and the various devices which make up the semiconductor structure have been identified so they correspond with the circuit which is shown in FIG. 1.

As can be seen from FIG. 1, the video amplifier basically consists of two transistors T1 and T3 in which the emitter of transistor T1 is connected to the base of the transistor T3. The base of the transistor T1 is connected to input No. 1 which is the principal input and typically would be connected to one side of the output of the video IF demodulator in a monochrome television set. The other input to the video amplifier is connected to the other side of the output of the video IF demodulator and is connected to the base of transistor T2.

The output stage consists of the transistors T3, T5 and T6. As can be seen, the collector of transistor T5 is connected to the plus voltage supply which can be 100 volts and the base of the transistor T5 is connected to the 100 volt supply through the resistor R5. The base of the transistor T5 is connected through the diode D1 to the collector of the transistor T6. The emitter of the transistor T5 is connected to the output terminal and is also connected to the collector of the transistor T6 through a diode D2. The emitter of the transistor T6 is connected to the collector of the transistor T3 and the emitter of the transistor T3 is connected through R6 to ground.

Let it be assumed that the lower portion of the output stage consisting of the transistors T6 and T3 is on. When this is the case, current is flowing through the diode D2 from the emitter of the transistor T5. A bias voltage of approximately 0.7 volts develops across diode D2. This bias voltage is applied across the base-emitter diode of the transistor T5 through the diode D1. Thus, when current is flowing through diode D2, the base-emitter diode of transistor T5 is held at zero voltage and T5 is, therefore, cut off.

When the transistors T6 and T3 are off, current stops flowing through the diode D2 and the bias voltage normally developed across diode D2 disappears and current can now flow into the base of the transistor T5 through the resistor R5. The transistor T5, therefore, acts as an emitter-follower and has a substantial current available to supply to the output terminal.

In other words, it can be seen that the resistor R5 still acts as a collector load resistor and that for positive waveforms, the load current flows through the emitter-follower transistor T5. As the current is drawn through transistors T3 and T6 (i.e., there is a negative waveform at the output), the diode D2 becomes forward biased. The base-emitter voltage of T5, therefore, drops to zero, cutting the transistor T5 off. Thus, the transistor T5 and the transistors T6 and T3 can never be on together.

The diode D1 is not absolutely essential. However, if it is eliminated, there will be a 1.2 volt band or difference between on and off voltage for the upper part of the output stage which will be reflected in the output waveform. In other words, the output waveform would have a cross-over distortion. The diode D1 reduces this cross-over distortion to approximately 0.6 volts.

The transistor T6 along with the resistor R4 and the diode D3 can be considered to be a cascode section. The transistor T6 is a common base stage and has a constant voltage at its base which is the Zener voltage of the diode D3 as fed by the resistor R4. The transistor T6 does not contribute to the gain of the video amplifier but it does effectively shield the transistor amplifier T3 from the large output voltage swing, and thus eliminates the effects of the so-called Miller capacitance which is the capacitance between the collector and the base of the transistor T3.

The biasing of the transistor amplifiers T1 and T3 is accomplished by deriving from the output terminal a current through the resistors R1 and R2 and feeding it into the transistor configuration T2 and T4 in which the emitter of the transistor T2 is connected to the base of transistor T4 and the emitter of the transistor T4 is connected through the resistor R3 to ground. Typically, the transistor T2 is identical to the transistor T1 and the transistor T4 is identical to the transistor T3. Also, the resistor R3 is the same size as resistor R6, e.g., 500 ohms. The amplifying transistors T1 and T3 are biased through the source. In other words, there is a small d.c. current flowing through the source between input 1 and input 2.

Since the transistors and resistors identified above are identical, the two collector currents in the transistors T2 and T4 must also be identical. In other words, the current flowing through resistors R1 and R2 is duplicated at the collector of the transistor T3 with the collector current of the transistor T3 passing through the resistor R5. The d.c. output voltage from the video amplifier is a function of the resistance ratio of R5 and R1 + R2 and the supply voltage. If resistors R5 and R1 + R2 are identical, then the output d.c. voltage will be one-half of the supply voltage independent of the absolute values of these resistors. By utilizing such ratios of resistors, it is possible to take advantage of the close ratio tolerances which can be achieved with bulk resistors or even other kinds of resistors as described in copending application, Ser. No. 791,660, filed Jan. 16, 1969. This makes it unnecessary to provide resistors in the integrated circuit which have close absolute tolerances.

The d.c. biasing arrangement hereinbefore described also serves as an a.c. feedback loop. A portion of the output voltage is fed back to the input. The ratio of the resistors R1 + R2 to resistor R3 determines the amount of feedback and, therefore, also the gain of the amplifier is determined by a ratio of the resistors rather than the absolute values of the resistors.

By way of example, an integrated video amplifier made in accordance with the present invention was capable of providing a voltage swing of up to 70 volts (peak-to-peak) with a voltage gain of approximately 50. Its frequency response was substantially greater than 3.5 MHz and extended up to approximately 7 MHz.

It is apparent from the foregoing that there has been provided an integrated video amplifier which has many significant advantages. It is capable of operating with high voltages to meet linear circuit applications. The output voltage can be held to a predetermined value no matter what the absolute value of the resistors or other components utilized in the circuit. It also makes use of a class B output stage which greatly reduces the power dissipation of the video amplifier. For example, it reduces power dissipation from approximately 1 ½ watts to 300 milliwatts.

I claim:

1. In an integrated video amplifier, a unitary semiconductor structure and means forming an input, first and second transistor amplifier stages formed in said semiconductor structure, each of said amplifier stages having at least one transistor with a base, a collector and an emitter, means connecting said input to the base of the transistor of the first transistor amplifier stage, means for biasing said first and second transistor amplifier stages including a first additional transistor having characteristics substantially identical to the transistor in the first transistor amplifier stage, a second additional transistor having characteristics substantially identical to the transistor in the second transistor amplifier stage, means connecting an output terminal to one of said additional transistors to an input terminal of the other of said additional transistors, means providing a supply voltage, an output stage including an output terminal, said second transistor amplifier stage forming a portion of said output stage, said biasing means also including first resistor means formed in said semiconductor structure and coupled between coupled output terminals of said first and second additional transistors which determine the current flow through said first resistor means and said output terminal, and second resistor means formed in said structure coupled between said first and second amplifier means and said supply voltage means said first and second resistor means having substantially identical characteristics to provide a constant ratio of resistance values such ratio determining the portion of said supply voltage which appears at said output terminal.

2. An amplifier according to claim 1 where the base of said one additional transistor provides a second input and said second additional transistor includes an emitter coupled resistor and such resistor in ratio with said first resistor means provides a feedback signal from said output terminal to said second input.

3. An amplifier as in claim 1 where said ratio is equal to one.

* * * * *